United States Patent [19]

Linder et al.

[11] Patent Number: 5,315,169

[45] Date of Patent: May 24, 1994

[54] POWER-EFFICIENT SAMPLE AND HOLD CIRCUIT USING BIPOLAR TRANSISTORS OF SINGLE CONDUCTIVITY TYPE

[75] Inventors: Lloyd F. Linder, Agoura Hills; Benjamin Felder, Saugus; Dwight D. Birdsall, Norwalk, all of Calif.

[73] Assignee: Hughes Aircraft Company, Los Angeles, Calif.

[21] Appl. No.: 894,980

[22] Filed: Jun. 8, 1992

[51] Int. Cl.[5] .................. H03K 5/24; H03K 17/74
[52] U.S. Cl. .................. 307/353; 307/321; 307/257
[58] Field of Search ............... 307/352, 353, 359, 257, 307/494, 351, 354, 491, 495, 496, 497, 499, 501, 530, 358

[56] References Cited

U.S. PATENT DOCUMENTS

| | | | |
|---|---|---|---|
| 3,480,795 | 11/1969 | Benson et al. | 307/353 |
| 3,721,829 | 3/1973 | Benson | 307/352 |
| 4,209,711 | 6/1980 | Barker | 307/257 |
| 4,659,945 | 4/1987 | Metz | 307/353 |

Primary Examiner—Timothy P. Callahan
Assistant Examiner—My-Trang Nu Ton
Attorney, Agent, or Firm—Georgann S. Grunebach; Terje Gudmestad; W. K. Denson-Low

[57] ABSTRACT

A diode bridge includes a plurality of diodes for coupling an input voltage signal to a holding capacitor for sampling when the diodes are forward biased, and uncoupling the voltage signal from the capacitor for holding when the diodes are reverse biased. The diode bridge has first and second bias current nodes. A constant current drain causes a constant bias current to flow out of the bridge. A transistor connects the first node to the drain for forward biasing the diodes, whereas a transistor connects the second node to the drain for reverse biasing the diodes. A bootstrap amplifier (A2) produces a variable control voltage which controls a pair of voltage-controlled constant current sources to cause the constant bias current to flow therethrough into the bridge. A transistor (Q7) couples the control voltage to the first current source for forward biasing the diodes, whereas a transistor couples the control voltage to the second current source for reverse biasing the diodes. The transistors are all bipolar and of the same conductivity type, preferably NPN.

13 Claims, 2 Drawing Sheets

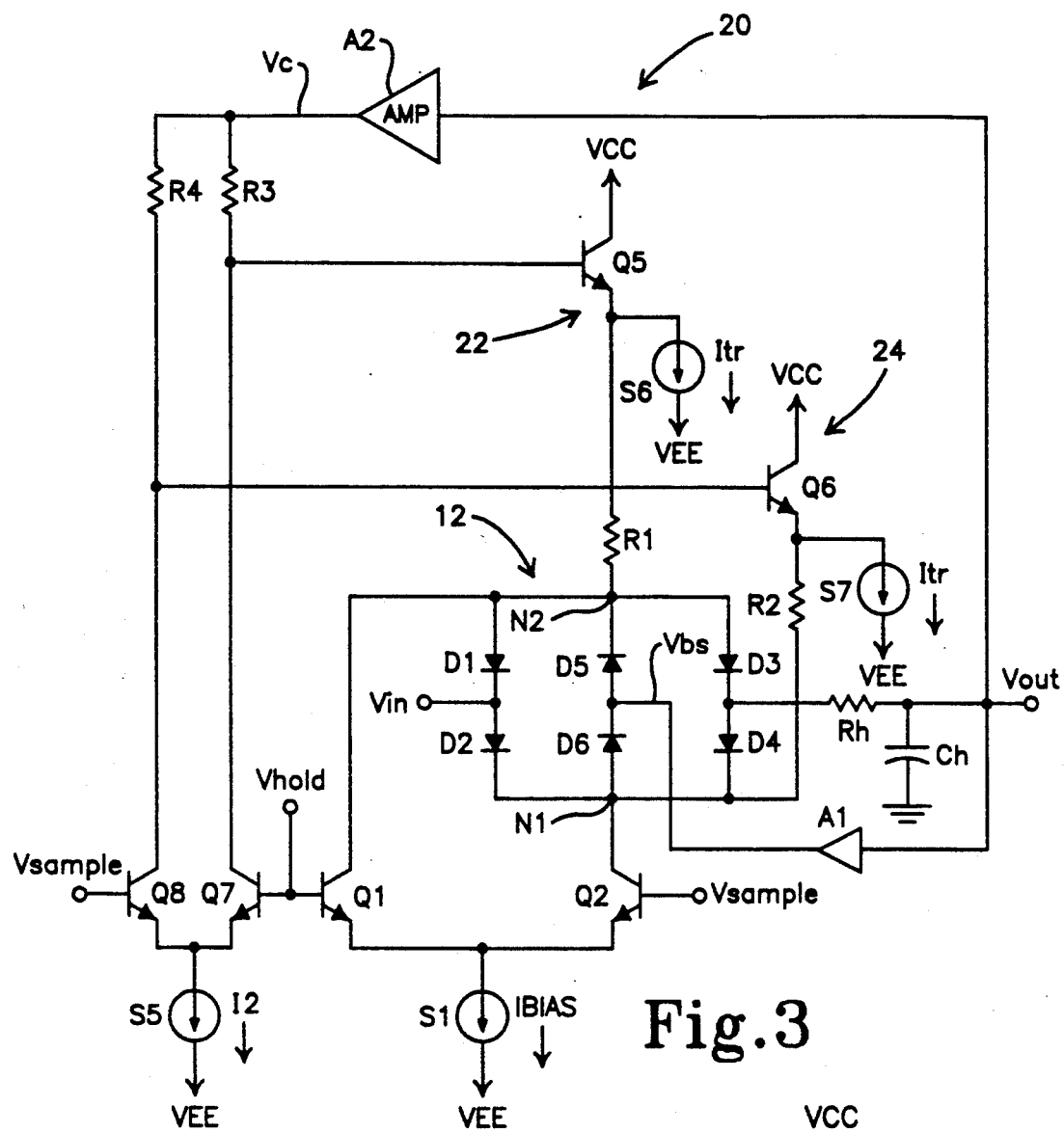
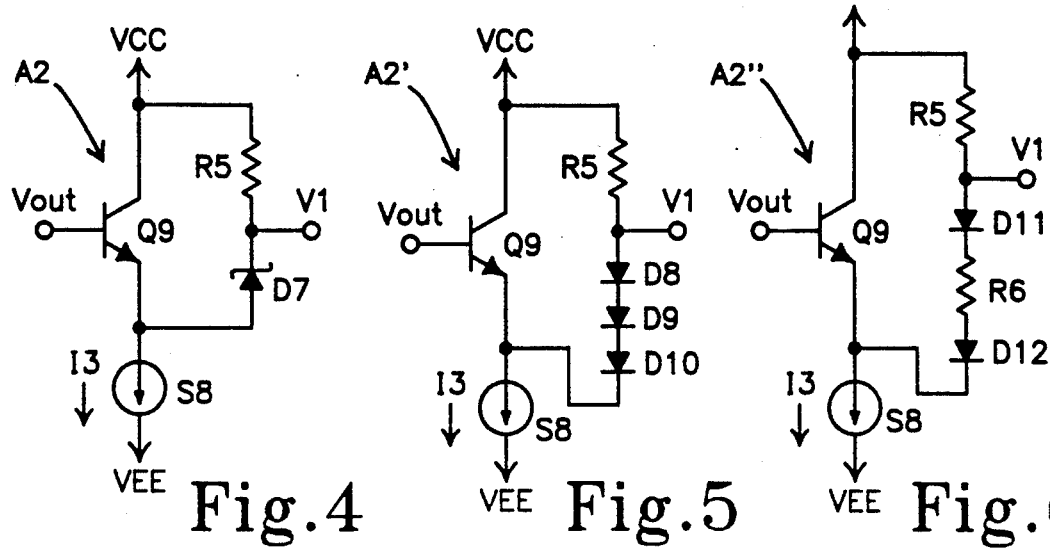
Fig.3
Fig.4  Fig.5  Fig.6

POWER-EFFICIENT SAMPLE AND HOLD CIRCUIT USING BIPOLAR TRANSISTORS OF SINGLE CONDUCTIVITY TYPE

BACKGROUND OF THE INVENTION

1. Field of the Invention

The present invention generally relates to the field of electronic waveform sampling circuits, and more specifically to a power-efficient sample and hold circuit using bipolar transistors of single conductivity type.

2. Description of the Related Art

Sample and hold circuits charge a holding element, which is usually a capacitor, to the instantaneous amplitude of an analog input signal during a tracking or sampling interval, and then uncouple the signal from the capacitor during a holding interval. The sampled voltage which is held by the capacitor is typically applied to an analog-to-digital converter which produces a corresponding digital value which is stored in a random access memory of a waveform processing unit. A set of stored digital values obtained at increments of a sampled waveform constitutes a digital approximation of the analog signal, and can be analyzed or processed using a variety of known algorithms in accordance with a particular application.

FIG. 1 illustrates a basic prior art sample and hold circuit 10 including a diode bridge 12 such as described in U.S. Pat. No. 4,659,945, entitled "SAMPLING BRIDGE", issued Apr. 21, 1987 to A. Metz. The bridge 12 has a first bias current node N1 and a second bias current node N2. The anodes of diodes D1 and D3 are connected to the node N2, whereas the cathodes of diodes D2 and D4 are connected to the node N1. The cathodes of the diodes D1 and D3 are connected to the anodes of the diodes D2 and D4 respectively. An analog input voltage signal Vin for sampling is applied to the junction of the diodes D1 and D2, whereas an output signal Vout which appears at the junction of the diodes D3 and D4 is applied through an integrating resistor Rh to an integrating or holding capacitor Ch.

The diode bridge 12 further includes a diode D5 having a cathode connected to the node N2, and a diode D6 having an anode connected to the node N1. The anode of the diode D5 is connected to the cathode of the diode D6. A unity-gain replica of the output signal Vout is fed back through a buffer amplifier A1 to the junction of the diodes D5 and D6 and designated as a bootstrap bias voltage Vbs. The diodes D5 and D6 are connected in anti-parallel relation to the diodes D1, D2, D3 and D4.

An NPN bipolar sampling transistor Q2 has a collector connected to the node N1 and an emitter connected to a constant current drain S1. A signal Vsample for selecting or commanding a tracking or sampling mode of operation is applied to the base of the transistor Q2. An NPN bipolar holding transistor Q1 has a collector connected to the node N2 and an emitter connected to the drain S1. A signal Vhold for selecting or commanding a holding mode of operation is applied to the base of the transistor Q1.

The drain S1 causes a predetermined constant bias current IBIAS to flow out of the bridge 12 through the node N1 and whichever transistor Q1 or Q2 is turned on into a voltage source VEE. A constant current source S2 is connected between a voltage source VCC, which produces a voltage higher than the voltage VEE, and the node N2. A constant current source S3, which is identical to the source S2, is connected between the voltage source VCC and the first node N1.

The sources S2 and S3 cause bias currents, each having a value of IBIAS/2, to flow into the bridge 12 through the nodes N2 and N1 respectively. In the illustrated topology in which the transistors Q1 and Q2 are of the NPN conductivity type, the sources S2 and S3 can be embodied by resistors (not shown).

The circuit 10 is operated in sampling mode by applying the sampling signal Vsample to the transistor Q2 and removing the holding signal Vhold from the transistor Q1. The transistor Q2 is turned on, thereby connecting the node N1 to the drain S1, whereas the transistor Q1 is turned off, thereby disconnecting the node N2 from the drain S1. The diodes D1, D2, D3 and D4 are forward biased, thereby coupling the signal Vin therethrough to the capacitor Ch which charges to the instantaneous value of the signal Vin to produce the signal Vout. The diodes D5 and D6 are reverse biased, and do not pass signal or bias current therethrough.

The bias current IBIAS flows out of the circuit 10 through the drain S1. Half of this current, IBIAS/2, flows through the source S2, node N2, diodes D1, D2, D3 and D4, node N1 and transistor Q2 to forward bias the diodes D1, D2, D3 and D4 and couple the input voltage signal Vin to the capacitor Ch. Another half IBIAS/2 of the bias current IBIAS flows through the source S3, node N1 and transistor Q2, and does not contribute to the sampling mode operation.

The circuit 10 is operated in holding mode by applying the holding signal Vhold to the transistor Q1 and removing the sampling signal Vsample from the transistor Q2. The transistor Q1 is turned on, thereby connecting the node N2 to the drain S1, whereas the transistor Q2 is turned off, thereby disconnecting the node N1 from the drain S1. The diodes D5 and D6 are forward biased by the bootstrap bias voltage Vbs, thereby causing the diodes D1, D2, D3 and D4 to be reverse biased and not pass signal or bias current therethrough, such that the signal Vin is uncoupled from the capacitor Ch.

The current IBIAS flows out of the circuit 10 through the drain S1 in holding mode as it does in sampling mode. Half of this current, IBIAS/2, flows through the source S3, node N1, diodes D5, and D6, node N2 and transistor Q1 to forward bias the diodes D5 and D6, reverse bias the diodes D1, D2, D3 and D4 and thereby uncouple the input voltage signal Vin from the capacitor Ch. Another half of this current, IBIAS/2, flows through the source S2, node N2 and transistor Q1, and does not contribute to the holding mode operation.

The diodes D5 and D6 must have a forward voltage drop which is larger than the forward voltage drop of the diodes D1, D2, D3 and D4 in order to cause the diodes D1, D2, D3 and D4 to be reverse biased when the diodes D5 and D6 are forward biased. Where a particular application must be implemented by diodes of a single type, the required effect can be produced by substituting two or more series diodes for each of the diodes D5 and D6, although not specifically illustrated.

The performance of the bridge 12 in following or tracking the input signal Vin can be improved by increasing the bias current flowing through the diodes D1, D2, D3 and D4 in the sampling mode. However, as described above, a current IBIAS/2, which is half of the total bias current IBIAS, flows around the bridge 12 from the source S3 and out through the node N1 in sampling mode rather than flowing through the diodes D1, D2, D3 and D4. This current IBIAS/2, which would improve the tracking performance of the bridge 12 if it flowed through the diodes D1, D2, D3 and D4 rather than bypassing the bridge 12, is wasted. The current IBIAS/2 which flows from the source S2 and out through the node N2 in holding mode is also wasted.

Another disadvantage of the circuit 10 in which the sources S2 and S3 are embodied as resistors is that since the voltage at the node N2 follows the input signal Vin, the current supplied into the bridge 12 through the sources S2 and S3 is modulated by the input voltage, thereby producing distortion in the signal Vout.

FIG. 2 illustrates an improvement to the circuit 10 in which all of the current IBIAS is caused to flow through the bridge 12 in both sampling and holding mode operation, in which like elements are designated by the same reference numerals used in FIG. 1. In a sample and hold circuit 16, the current sources S2 and S3 of the circuit 10 are replaced by a single constant bias current source S4 which causes the full bias current IBIAS to flow into the bridge 12. The circuit 16 includes a PNP bipolar transistor Q3 having an emitter connected to the source S4, a collector connected to the node N2 and a base connected to receive the sampling signal Vsample through an invertor IV1. A PNP bipolar transistor Q4 has an emitter connected to the source S4, a collector connected to the node N1 and a base connected to receive the holding signal Vhold through an invertor IV2.

In sampling mode, the transistor Q3 is turned on by the inverted sampling signal Vsample, thereby connecting the node N2 to the source S4. The transistor Q4 is turned off, thereby disconnecting the node N1 from the source S4. This causes the entire bias current IBIAS to flow from the source S4 through the transistor Q3, diodes D1, D2, D3 and D4 and transistor Q2 to the drain S1.

In holding mode, the transistor Q4 is turned on by the inverted holding signal Vhold, thereby connecting the node N1 to the source S4. The transistor Q3 is turned off, thereby disconnecting the node N2 from the source S4. This causes the entire bias current IBIAS to flow from the source S4 through the transistor Q4, diodes D5 and D6 and transistor Q1 to the drain S1.

Although the circuit 16 overcomes the drawbacks of the circuit 10 in that none of the bias current is wasted, the entire bias current is caused to flow through the bridge 12 in sampling mode and modulation of the source current by the input voltage is eliminated, it is not applicable to an integrated circuit topology in which all of the transistors must have the same conductivity type, either NPN or PNP. The circuit 16 is implemented by a complementary bipolar topology, with the transistors Q1 and Q2 being NPN conductivity type and the transistors Q3 and Q4 being PNP conductivity type.

Although it is theoretically possible to replace the transistors Q3 and Q4 with NPN transistors having their emitters and collectors reversed from the illustrated arrangement, the resulting circuit would be inoperative since the emitters of the NPN transistors would be connected to the bridge 12, the transistors would operate as emitter followers, and the voltage at the node N2 would follow the signal Vsample rather than the signal Vin.

SUMMARY OF THE INVENTION

A sample and hold circuit embodying the present invention includes a diode bridge having a plurality of diodes for coupling an input voltage signal to a holding capacitor for sampling when the diodes are forward biased, and uncoupling the voltage signal from the capacitor for holding when the diodes are reverse biased. The diode bridge has a first bias current node and a second bias current node.

A constant current drain causes a constant bias current to flow out of the bridge. A first bipolar sampling transistor connects the first node to the current drain for forward biasing the diodes, whereas a first bipolar holding transistor connects the second node to the current drain for reverse biasing the diodes.

A first voltage-controlled constant current source including a first bipolar source transistor and a resistor is connected to the second node, whereas a second voltage-controlled constant current source including a second bipolar source transistor and a resistor is connected to the first node.

A bootstrap amplifier produces a variable control voltage which is shifted from the voltage signal by an offset voltage selected to control the first and second current sources to cause the constant bias current to flow therethrough into the bridge. A second bipolar holding transistor couples the control voltage to the first current source for forward biasing the diodes, whereas a second bipolar sampling transistor couples the control voltage to the second current source for reverse biasing the diodes.

The present sample and hold circuit improves over the prior art circuit 10 illustrated in FIG. 1 by utilizing all of the bias current, and causing all of the bias current to flow through the diode bridge in sampling mode. The present circuit further overcomes the limitations of the prior art circuit 16 illustrated in FIG. 2 by enabling all of the bipolar transistors to be of the same conductivity type, preferably NPN.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 3 is an electrical schematic diagram of a sample and hold circuit embodying the present invention; and FIGS. 4, 5 and 6 are electrical schematic diagrams illustrating alternative bootstrap amplifiers for producing a variable bias control voltage in the circuit of FIG. 3.

DETAILED DESCRIPTION OF THE INVENTION

Figure 1:
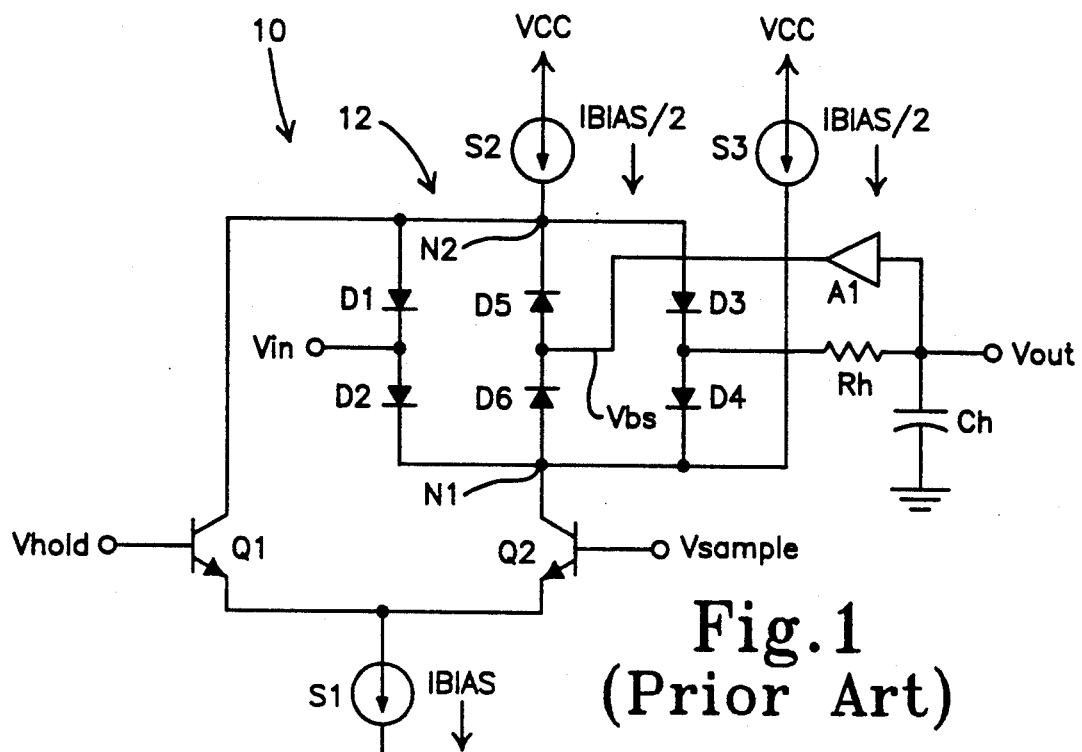
FIG. 1 is an electrical schematic diagram of a prior art sample and hold circuit including a diode bridge.
Figure 2:
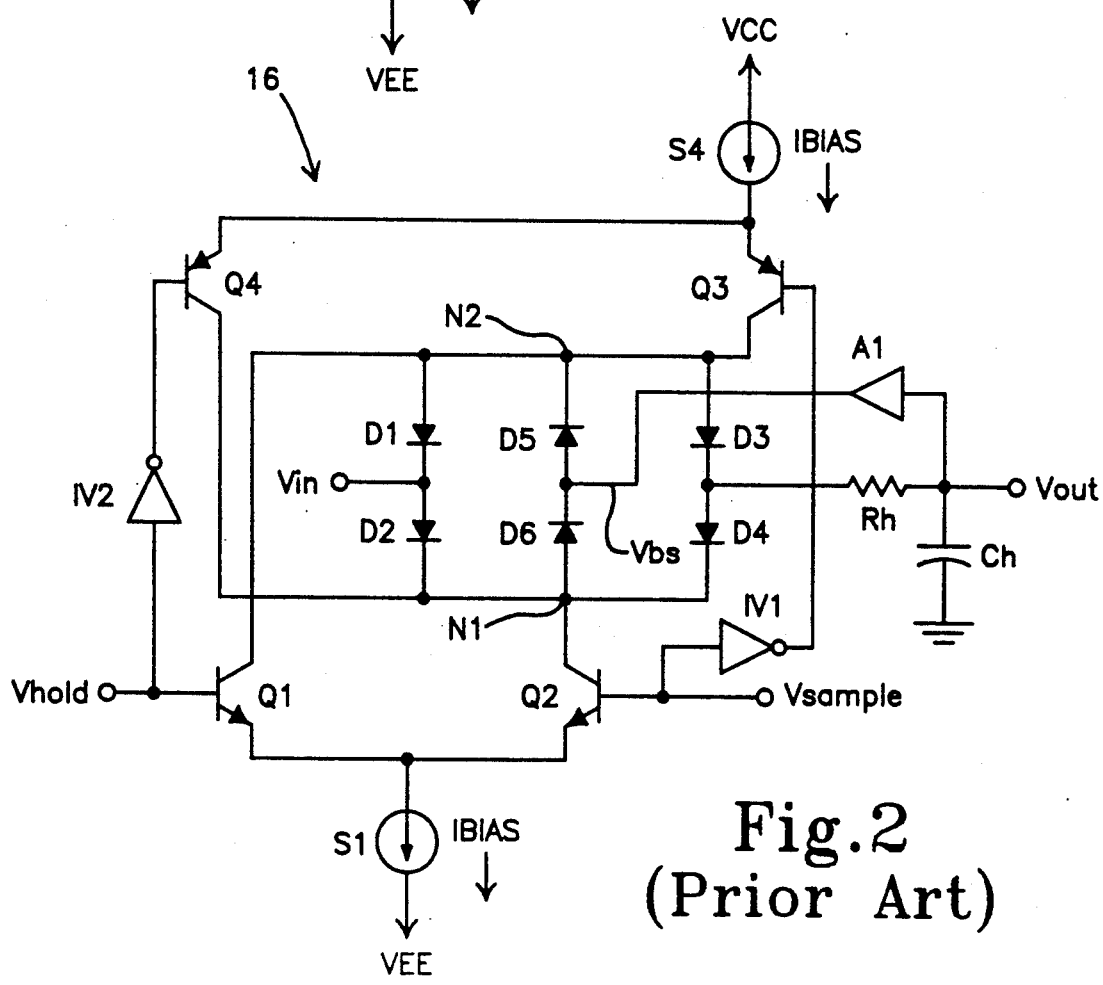
FIG. 2 is similar to FIG. 1, but illustrates an improved circuit.

A sample and hold circuit embodying the present invention is illustrated in FIG. 3 and designated as 20. The circuit 20 includes the diode bridge 12, constant current drain S1 and transistors Q1 and Q2 which function in the manner described above with reference to FIG. 1.

A first voltage-controlled current source 22 includes an NPN bipolar transistor Q5 having a collector connected to the voltage source VCC and an emitter connected through a resistor R1 to the node N2. A second voltage controlled current source 24 includes an NPN bipolar transistor Q6 having a collector connected to the voltage source VCC and an emitter connected through a resistor R2 to the node N1.

The circuit 20 further includes a constant current drain S5 which causes a predetermined constant bias current I2 to flow therethrough into the source VEE. A second NPN bipolar holding transistor Q7 has an emitter connected to the drain S5 and a base connected to receive the holding selection signal Vhold. A second NPN bipolar sampling transistor Q8 has an emitter connected to the drain S5 and a base connected to receive the sampling selection signal Vsample.

It will be understood from further description that the holding transistor Q7 is turned off in sampling mode and the sampling transistor Q8 is turned off in holding mode. This is accomplished by applying the holding selection signal Vhold to the holding transistor Q7 and applying the sampling selection signal Vsample to the sampling transistor Q8.

The circuit 20 further includes a bootstrap amplifier A2 which produces a control voltage Vc in response to the signal Vout. The collector of the transistor Q7 is connected to the output of the amplifier A2 through a resistor R3, and also to the base of the transistor Q5. The collector of the transistor Q8 is connected to the output of the amplifier A2 through a resistor R4, and also to the base of the transistor Q6.

The amplifier A2 adds a first offset voltage V01 to the voltage Vout such that $$Vc = Vout + V01$$

In sampling mode, the voltage at the node N2 is one diode drop Vbe (approximately 0.8 volts) above Vout, the voltage at the node N1 is one diode drop Vbe below Vout and the voltage at the emitter of the transistor Q5 is one diode drop Vbe below Vc. The resistors R1 and R2 each have a resistance value RV1, and the offset voltage V01 is predetermined such that $$(V01 - 2Vbe)/RV1 = IBIAS$$

Sampling mode is selected by applying the sampling selection signal Vsample to the transistors Q2 and Q8 which turns them on. The holding selection is not generated, such that the transistors Q1 and Q7 are turned off. The transistor Q2 connects the node N1 to the drain S1 as described above.

Since the transistor Q7 is turned off, the entire voltage Vc is applied to the base of the transistor Q5. The current flow through the resistor R1 is equal to the voltage thereacross divided by its resistance value. Since the transistor Q5 is connected as an emitter follower, its emitter voltage is one diode drop Vbe below its base voltage.

The voltage at the end of the resistor R which is connected to the emitter of the transistor Q5 is therefore Vc−Vbe. The voltage at the end of the resistor R1 which is connected to the node N2 is Vout+Vbe. The voltage across the resistor R1 is therefore Vc−(Vout+2Vbe), or V01−2Vbe. The current flowing through the resistor R1 into the node N2 is therefore (V01−2Vbe)/RV1=IBIAS.

The arrangement of the bootstrap amplifier A2 in combination with the voltage-controlled constant current source 22 causes the current IBIAS to flow into the node N2 for all values of the input voltage Vin in sampling mode. Since the output voltage Vout substantially tracks and is equal to the input voltage Vin, the voltage at the node N2 (lower end of the resistor R1) will always be Vout+Vbe and the voltage at the emitter of the transistor Q5 (upper end of the resistor R1) will always be Vout+V01−Vbe. Thus, the voltage across the resistor R1 will always be V01−2Vbe and the current through the resistor R1 (flowing into the node N2) will always be (V01−2Vbe)/RV1=IBIAS.

The resistors R3 and R4 each have a resistance value RV2, and the bias current I2 is predetermined such that the current I2 flowing through the resistor R3 or R4 will produce a voltage drop or second offset voltage V02 across the resistor R3 or R4 such that $$V02 = I2 \times RV2$$

In sampling mode, the transistor Q8 is turned on, thereby connecting the lower end of the resistor R4 to the drain S5. This causes the constant current I2 to flow through the resistor R4, producing the second offset voltage V02 to be dropped across the resistor R4. The voltage applied to the transistor Q6 is therefore $$Vc - V02$$

and is predetermined to bias the transistor Q6 such that no current flows therethrough into the resistor R2 and thereby disable or inhibit the second current source 24.

To summarize the operation of the circuit 20 in sampling mode, the bias current IBIAS flows into the bridge 12 from the source 22 through the node N2, and out of the bridge 12 through the node N1 into the drain S1.

Holding mode operation is selected by applying the holding selection signal Vhold to the transistors Q1 and Q7 which turns them on. The sampling selection signal Vsample is not generated, such that the transistors Q2 and Q8 are turned off. The transistor Q1 connects the node N2 to the drain S1 as described above.

The holding mode operation is symmetrical to the sampling mode operation. Since the transistor Q8 is turned off, the control voltage Vc is applied to turn on the transistor Q6 and cause the bias current IBIAS to flow through the second current source 24 into the node N1. Since the transistor Q7 is turned on, the voltage Vc−V02 is applied to bias the transistor Q5 such that no current flows therethrough into the resistor R1 and thereby inhibit the first current source 22.

To summarize the operation of the circuit 20 in holding mode, the bias current IBIAS flows into the bridge 12 from the source 24 through the node N1, and out of the bridge 12 through the node N2 into the drain S1.

The present circuit 20 enables all of the bias current IBIAS to flow through the bridge 12 in both sampling and holding modes, yet is implemented using bipolar transistors of the same conductivity type. Although the preferred conductivity type is NPN, the present invention can be alternatively embodied using bipolar PNP transistors with the appropriate connections reversed and voltage levels shifted.

In addition, the present invention is not limited to conventional bipolar transistors, but can be alternatively embodied using other transistors of single conductivity type, such as P-type Metal-Oxide-Semiconductor (PMOS), N-type Metal-Oxide-Semiconductor (NMOS), Gallium Arsenide (GaAs), High-Electron-Mobility Transistor (HEMT) or Heterojunction-Bipolar-Transistor (HBT).

In a practical circuit application, it is undesirable to have zero current flow through the transistors Q5 and Q6, as this would slow down the transistor switching speed. For this reason, current drains S6 and S7 are preferably provided, and the offset voltage V02 across the resistors R3 and R4 selected to cause a trickle current Itr to flow out of the emitters of the transistors Q5 and Q6 into the source VEE when the current sources 22 and 24 are inhibited in the holding and sampling modes respectively.

A preferred configuration for the bootstrap amplifier A2 is illustrated in FIG. 4. The output voltage Vout is applied to the base of an NPN bipolar transistor Q9. A constant current drain S8 causes a constant current I3 to flow out of the amplifier A2 into the source VEE. The collector of the transistor Q9 is connected to the source Vcc. A load resistor R5 is connected at one end to the collector of the transistor Q9 and at the other end to the cathode of a zener diode D7. The anode of the diode D7 is connected to the emitter of the transistor Q9. The control voltage Vc appears at the cathode of the diode D7.

Since the transistor Q9 is connected as an emitter follower, its emitter voltage is Vout−Vbe. The reverse voltage drop of the zener diode D7 is selected to equal the offset voltage V01. The voltage at the cathode of the diode D7 is therefore V1=Vout+V01.

FIG. 5 illustrates an alternative bootstrap amplifier A2′ in which the zener diode D7 is replaced by a plurality, illustrated as three, conventional diodes D8, D9 and D10 connected in series. Whereas the zener diode D7 of the amplifier A2 is connected to be reverse biased, the diodes D8, D9 and D10 are connected to be forward biased. In this case, the sum of the forward voltage drops across the diodes D8, D9 and D10 is selected to equal the offset voltage V01.

FIG. 6 illustrates another alternative bootstrap amplifier A2″ in which the offset voltage V01 is produced across forward biased conventional diodes D11 and D12 connected in series with a resistor R6. This configuration is useful when the required offset voltage V01 is larger than can be produced by a practical number of diodes.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A sample and hold circuit, comprising:
voltage holding means;
diode bridge means including a plurality of diodes for coupling a voltage signal to the holding means for sampling when said diodes are forward biased and uncoupling the voltage signal from the holding means for holding when said diodes are reverse biased, reverse biasing means for reverse biasing the diodes, a first bias current node and a second bias current node;
first constant current drain means for causing a first predetermined constant bias current to flow out of the bridge means;
first sampling switch means for connecting the first node to the first current drain means and disconnecting the second node from the first current drain means for forward biasing said diodes;
first holding switch means for connecting the second node to the first current drain means and disconnecting the first node from the first current drain means for reverse biasing said diodes;
first voltage-controlled current source means connected to the second node;
second voltage-controlled current source means connected to the first node;
bootstrap amplifier means for producing a variable control voltage which is shifted from the voltage signal by a first predetermined offset voltage selected to control the first and second voltage-controlled current source means to cause said first bias current to flow through the first or second voltage-controlled current source means into the bridge means;
second holding switch means for coupling the control voltage to the first voltage-controlled current source means for forward biasing said diodes and inhibiting the first voltage-controlled current source means for reverse biasing said diodes; and
second sampling switch means for coupling the control voltage to the second voltage-controlled current source means for reverse biasing said diodes and inhibiting the second current source means for forward biasing said diodes.

2. A circuit as in claim 1, in which the first and second sampling switch means and the first and second holding switch means each comprise bipolar transistors of the same conductivity type.

3. A circuit as in claim 2, in which the first and second voltage-controlled current source means each comprise bipolar transistors of said conductivity type.

4. A circuit as in claim 3, in which said conductivity type is NPN.

5. A circuit as in claim 1 in which:
the first voltage-controlled current source means comprises:
a first NPN bipolar transistor having a base connected to receive said control voltage from the second holding switch means, a collector connected to receive a supply voltage and an emitter; and
a first resistor connected between the emitter of the first transistor and the second node; and
the second voltage-controlled current source means comprises:
a second NPN bipolar transistor having a base connected to receive said control voltage from the second sampling switch means, a collector connected to receive the supply voltage and an emitter; and
a second resistor connected between the emitter of the second transistor and the first node.

6. A circuit as in claim 5, further comprising second constant current drain means for causing a second predetermined constant bias current to selectably flow out of the second sampling switch means or the second holding switch means, in which:
the second holding switch means comprises:

a third NPN bipolar transistor having a base, an emitter connected to the second drain means and a collector, the third transistor being turned on by a holding selection signal applied to the base thereof and turned off when the holding selection signal is removed from the base thereof; and a third resistor having a predetermined resistance value, a first end connected to the collector of the third transistor and a second end connected to receive the control voltage from the amplifier means, the collector of the third transistor being connected to the base of the first transistor;

the second sampling switch means comprises:

a fourth NPN bipolar transistor having a base, an emitter connected to the second drain means and a collector, the fourth transistor being turned on by a sampling selection signal applied to the base thereof and turned off when the sampling selection signal is removed from the base thereof; and a fourth resistor having said resistance value, a first end connected to the collector of the fourth transistor and a second end connected to receive the control voltage from the amplifier means, the collector of the fourth transistor being connected to the base of the second transistor;

the control voltage is applied to the base of the first or second transistor when the third or fourth transistor is turned off respectively; and said second bias current and said resistance value are selected such that a second predetermined offset voltage is produced across the third or fourth resistor which causes the first or second transistor to be turned off and thereby inhibits the first or second voltage-controlled current source means when the third or fourth transistor is turned on respectively.

7. A circuit as in claim 6, in which:

the first sampling switch means comprises a fifth NPN bipolar transistor connected between the first node and the first current drain means; and the first holding switch means comprises a sixth NPN bipolar transistor connected between the second node and the first current drain means.

8. A circuit as in claim 7, in which:

the fifth transistor has an emitter connected to the first current drain means, a collector connected to the first node and a base connected to receive the sampling selection signal; and the sixth transistor has an emitter connected to the first current drain means, a collector connected to the second node and a base connected to receive the holding selection signal.

9. A circuit as in claim 5, in which:

the first voltage-controlled current source means further comprises second constant current drain means for causing a predetermined trickle current to flow out of the emitter of the first transistor; and the second voltage-controlled current source means further comprises third constant current drain means for causing said trickle current to flow out of the emitter of the second transistor.

10. A circuit as in claim 1, in which the voltage holding means comprises a capacitor.

11. A sample and hold circuit employing all npn bipolar transistors, comprising:

input and output terminals;

a diode bridge interconnecting the input and output terminals so that the voltage at the output terminal tracks the voltage at the input terminal in response to a constant current flow through the bridge;

a voltage controlled npn transistor current source for supplying current to the bridge;

npn transistor voltage controlled means for diverting current from the bridge and reverse-biasing the bridge diodes; and an npn transistor voltage control circuit that tracks the voltage at the output terminal to (1) cause said voltage controlled current source to provide a substantially constant current to the diode bridge during a sample mode, and (2) provide an actuating voltage to the voltage controlled current diverting means during a hold mode.

12. A circuit as in claim 11, in which the voltage control circuit inhibits the voltage controlled current source during hold mode and inhibits the voltage controlled diverting means during sample mode.

13. A sample and hold circuit, comprising:

input and output terminals;

a diode bridge interconnecting the input and output terminals so that the voltage at the output terminal tracks the voltage at the input terminal in response to a constant current flow through the bridge;

a voltage controlled current source for supplying current to the bridge;

voltage controlled means for diverting current from the bridge and reverse-biasing the bridge diodes; and a voltage control circuit that tracks the voltage at the output terminal and causes said voltage controlled current source to provide a substantially constant current to the diode bridge during a sample mode, and an actuating voltage to the voltage controlled current diverting means during a hold mode, said voltage control circuit comprising:

bootstrap amplifier means for producing the constant actuating voltage as being shifted from the voltage at the output terminal by a predetermined offset voltage selected to cause said constant current flow through the voltage controlled current source into the bridge in sample mode, and through the voltage controlled means form the bridge in hold mode;

holding switch means for coupling the constant actuating voltage to the voltage controlled current source and inhibiting the voltage controlled means during sample mode; and sampling switch means for coupling the actuating voltage to the voltage controlled means and inhibiting the voltage controlled current source during sample mode.

* * * * *